United States Patent
Kim et al.

(10) Patent No.: US 12,284,886 B2
(45) Date of Patent: Apr. 22, 2025

(54) ELECTROLUMINESCENCE DISPLAY DEVICE INCLUDING AUXILIARY ELECTRODE

(71) Applicant: LG Display Co., Ltd., Seoul (KR)

(72) Inventors: MoonSoo Kim, Paju-si (KR); Sungbai Lee, Paju-si (KR); Suhyeon Kim, Paju-si (KR)

(73) Assignee: LG DISPLAY CO., LTD., Seoul (KR)

(\*) Notice: Subject to any disclaimer, the term of this patent is extended or adjusted under 35 U.S.C. 154(b) by 589 days.

(21) Appl. No.: 17/516,116

(22) Filed: Nov. 1, 2021

(65) Prior Publication Data

US 2022/0140060 A1    May 5, 2022

(30) Foreign Application Priority Data

Nov. 5, 2020  (KR) ........................ 10-2020-0146500

(51) Int. Cl.
*H10K 59/131* (2023.01)
*H10K 50/814* (2023.01)
(Continued)

(52) U.S. Cl.
CPC ......... *H10K 59/131* (2023.02); *H10K 50/814* (2023.02); *H10K 50/818* (2023.02); *H10K 50/824* (2023.02)

(58) Field of Classification Search
CPC .. H10K 59/131; H10K 50/814; H10K 50/818; H10K 50/824; H10K 50/81; H10K 71/831; H10K 59/12; H10K 59/80516; H10K 59/80522; H10K 50/82; H10K 59/123; H01L 27/124
See application file for complete search history.

(56) References Cited

U.S. PATENT DOCUMENTS 9,178,181 B2    11/2015   Lee et al.
2011/0198597 A1\*  8/2011   Antonenkov .... H10K 59/80522
                                              438/34
(Continued)

FOREIGN PATENT DOCUMENTS

KR    10-2015-0024734 A    3/2015
KR    10-2016-0047110 A    5/2016
(Continued)

OTHER PUBLICATIONS

Office Action dated Dec. 9, 2024 issued in corresponding Korean Patent Application No. 10-2020-0146500.

*Primary Examiner* — Chad M Dicke
*Assistant Examiner* — Jeremy Daniel Watts
(74) *Attorney, Agent, or Firm* — Morgan, Lewis & Bockius LLP

(57) ABSTRACT

An electroluminescence display device comprises a substrate including a pixel area having a light emitting portion and a non-light emitting portion adjacent to the light emitting portion; a first electrode in the light emitting portion of the pixel area; an auxiliary electrode in the non-light emitting portion of the pixel area and spaced apart from the first electrode; a light emitting layer on the first electrode; a second electrode on the light emitting layer in the pixel area and connected to the light emitting layer; and an auxiliary power electrode below the first electrode and electrically connected with the auxiliary electrode.

20 Claims, 12 Drawing Sheets

(51) Int. Cl.
    *H10K 50/818*     (2023.01)
    *H10K 50/824*     (2023.01)

(56)           References Cited

U.S. PATENT DOCUMENTS

| | | | |
|---|---|---|---|
| 2016/0141545 A1* | 5/2016 | Kim | H10K 50/844 |
| | | | 257/40 |
| 2016/0284785 A1* | 9/2016 | Matsuura | H10K 59/131 |
| 2018/0097047 A1* | 4/2018 | Jung | H10K 59/80522 |
| 2019/0115403 A1* | 4/2019 | Kang | H01L 29/78633 |
| 2019/0165301 A1 | 5/2019 | Kim et al. | |
| 2019/0273125 A1* | 9/2019 | Takechi | H10K 59/80518 |
| 2022/0013609 A1* | 1/2022 | Won | H10K 59/123 |
| 2022/0102331 A1* | 3/2022 | Do | H01L 25/167 |
| 2022/0173178 A1* | 6/2022 | Kanehiro | H05B 33/14 |
| 2023/0361259 A1* | 11/2023 | Yun | H01L 25/167 |

FOREIGN PATENT DOCUMENTS

| | | |
|---|---|---|
| KR | 10-2018-0065731 A | 6/2018 |
| KR | 10-2019-0063964 A | 6/2019 |
| KR | 10-2020-0045904 A | 5/2020 |

\* cited by examiner

ELECTROLUMINESCENCE DISPLAY DEVICE INCLUDING AUXILIARY ELECTRODE

CROSS-REFERENCE TO RELATED APPLICATIONS

This application claims the benefit of and priority to Korean Patent Application No. 10-2020-0146500 filed on Nov. 5, 2020, which is hereby incorporated by reference as if fully set forth herein.

BACKGROUND

1. Technical Field

The present disclosure relates to an electroluminescence display device.

2. Discussion of the Related Art

With the advancement of the information age, the demand for a display device for displaying an image has increased in various forms. Therefore, various types of display devices, such as a liquid crystal display (LCD) device, a field emission display (FED) device, a plasma display panel (PDP) device, and an electroluminescence display device, have been recently used.

Among such display devices, the electroluminescence display device is classified into an inorganic light emitting display device and an organic light emitting display device, depending on a material of a light emitting layer. The organic light emitting display device is a self-luminance display device using an organic light emitting diode which injects holes from an anode and electrons from a cathode into a light emitting layer and emits light when an exciton generated by combination of the injected holes and electrons falls from an excited state to a ground state.

The organic light emitting display device does not need a separate light source, unlike a liquid crystal display (LCD) device, and thus may be manufactured in a lightweight and thin form. Further, the organic light emitting display device is advantageous in view of power consumption since it is driven with a low voltage. Also, the organic light emitting display device generally has excellent color expression ability, a high response speed, a wide viewing angle, and a high contrast ratio (CR) in comparison to other types of display devices in use. Therefore, the organic light emitting display device has been researched as a next-generation display device.

The organic light emitting display device may be manufactured by a manufacturing process of forming a thin film transistor (TFT) and a manufacturing process of forming an organic light emitting element on the thin film transistor.

The manufacturing process of forming the organic light emitting element may cause a short due to particles generated between an anode and a cathode, thereby causing a dark defect.

This problem may be more of an issue in a top emission display device. That is, since the top emission display device relies on transmittance of the cathode positioned on an upper layer of the organic light emitting element, the cathode may be formed by sputtering of a transparent conductive material, such as indium tin oxide (ITO), or an opaque conductive material that is very thin. In this case, when particles are placed on the anode, the cathode may be deposited between air gaps caused by the particles, and a short between the anode and the cathode may occur.

The cathode constituting the organic light emitting element may be formed over a large portion of an entire surface of a substrate. If the cathode is formed of a transparent conductive material, such as ITO, electrical resistance may be increased whereby a low potential power voltage may not be maintained at a constant voltage value over an entire area of the cathode. For this reason, a problem may occur in that image quality may be deteriorated.

The disclosure of the above-described background art is owned by the inventors of the present disclosure to devise the present disclosure or is technical information acquired by a process of devising the present disclosure, but cannot be regarded as the known art disclosed to the general public before the present disclosure.

SUMMARY

Accordingly, the present disclosure is directed to an electroluminescence display device that substantially obviates one or more problems due to limitations and disadvantages of the related art.

The present disclosure has been made in view of the above problems, and it is an object of the present disclosure to provide an electroluminescence display device that may improve an effect of an aging process for removing defects due to a short between an anode and a cathode and minimize electrical resistance of the cathode.

In addition to the objects of the present disclosure as mentioned above, additional objects and features of the present disclosure will be clearly understood by those skilled in the art from the following description of the present disclosure.

To achieve these objects and other advantages and in accordance with the purpose of the present disclosure, as embodied and broadly described herein, an electroluminescence display device may comprise: a substrate including a pixel area having a light emitting portion and a non-light emitting portion adjacent to the light emitting portion; a first electrode in the light emitting portion of the pixel area; an auxiliary electrode in the non-light emitting portion of the pixel area and spaced apart from the first electrode; a light emitting layer on the first electrode; a second electrode on the light emitting layer in the pixel area and connected to the light emitting layer; and an auxiliary power electrode below the first electrode and electrically connected with the auxiliary electrode.

In accordance with another aspect of the present disclosure, an electroluminescence display device may comprise: a substrate having a display area and a pad area; a light emitting element in the display area and having a first electrode, a second electrode, and a light emitting layer interposed between the first electrode and the second electrode; an auxiliary electrode in the display area and spaced apart from the first electrode; and a power pad in the pad area and including a first common power pad electrically connected with the second electrode and a second common power pad electrically connected with the auxiliary electrode.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiment(s) of the disclosure and together with the description serve to explain the principles of the disclosure. In the drawings.

DETAILED DESCRIPTION

Figure 1:
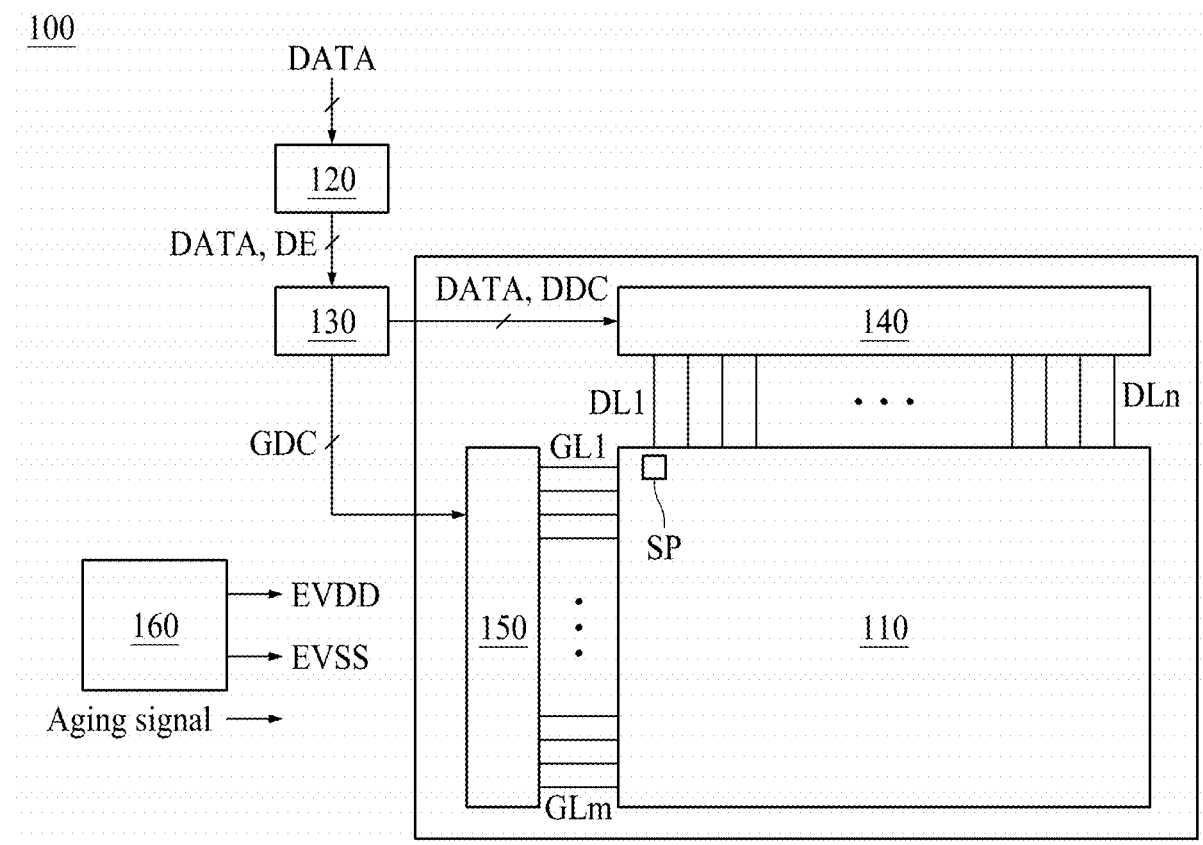
FIG. 1 is a schematic block view illustrating an electroluminescence display device according to an example embodiment of the present disclosure.

Reference will now be made in detail to embodiments of the present disclosure, examples of which are illustrated in the accompanying drawings.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings in order to describe various example embodiments of the present disclosure, are merely given by way of example. Therefore, the present disclosure is not limited to the illustrated details. Like reference numerals refer to like elements throughout the specification unless otherwise specified.

In the following description, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is construed as including an error or tolerance range even where no explicit description of such an error or tolerance range is provided.

In the description of the various embodiments of the present disclosure, where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," and the like may be used herein to describe various elements, these elements should not be limited by these terms as they are not used to define a particular order. These terms are used only to distinguish one element from another. For example, a first element could be termed a second element, and, similarly, a second element could be termed a first element, without departing from the scope of the present disclosure.

Terms like "first horizontal axis direction," "second horizontal axis direction," and "vertical axis direction" should not be interpreted only based on a geometrical relationship in which the respective directions are perpendicular to one another, and may encompass directions respectively within wider ranges of directions within which the elements of the present disclosure can operate functionally.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, an electroluminescence display device according to example embodiments of the present disclosure will be described in detail with reference to the attached drawings. Wherever possible, the same reference numbers will be used throughout the drawings to refer to the same or like parts. Since a scale of each of elements shown in the accompanying drawings may be different from an actual scale for convenience of description, the present disclosure is not limited to the shown scale.

FIG. 1 is a schematic block view illustrating an electroluminescence display device according to an example embodiment of the present disclosure.

As shown in FIG. 1, an electroluminescence display device 100 according to an example embodiment of the present disclosure may include a display panel 110, an image processor 120, a timing controller 130, a data driver 140, a scan driver 150, and a power supply 160.

The display panel 110 may display an image in response to a data signal DATA supplied from the data driver 140, a scan signal supplied from the scan driver 150, and a power source supplied from the power supply 160. The display panel 110 may include subpixels SP that operate to display an image.

The subpixels SP may be formed in a top emission method, a bottom emission method, or a dual emission method in accordance with a structure. The subpixels SP may include a red subpixel, a green subpixel, and a blue subpixel, or may include a red subpixel, a blue subpixel, a white subpixel, and a green subpixel. The subpixels SP may have one or more different light emission areas in accordance with light emission characteristics. One or more subpixels SP may constitute one unit pixel. For example, one unit pixel may include red, green, blue, and white subpixels, which may repeatedly be disposed or may be disposed in a quad type. For example, in a quad-type arrangement, blue and red subpixels may be disposed in a first scan line, and green and white subpixels may be disposed in a second scan line. However, without limitation to this example, in the embodiments according to the present disclosure, such implementation details like a color type, an arrangement type, an arrangement order, and so on of the subpixels may be configured in various forms depending on the light emission characteristics, lifespan of an element, specification of the device, and the like.

The subpixels SP of the electroluminescence display according to an example embodiment of the present disclosure may be formed by sequentially depositing a first electrode layer (e.g., an anode), a light emitting layer (e.g., an organic material layer), and a second electrode layer (e.g., a cathode) on a substrate. In this way, in the process of depositing an organic material, a short may occur due to particles generated between the first electrode layer and the second electrode layer. Since a dark spot defect or bright spot defect may occur in the subpixel for this reason, an aging process for normalizing the dark spot by removing the possible short caused by particles may be performed for the electroluminescence display device after the display panel is fabricated and before the display panel is modularized.

The image processor 120 may output a data enable signal DE together with the data signal DATA supplied from an external device. The image processor 120 may output one or more of a vertical synchronization signal, a horizontal synchronization signal, and a clock signal in addition to the data enable signal DE, but these signals are not shown for convenience of description.

The timing controller 130 may be supplied with the data signal DATA together with a driving signal, which may include the data enable signal DE and one or more of the vertical synchronization signal, the horizontal synchronization signal, and the clock signal from the image processor 120. The timing controller 130 may output a data timing control signal DDC for controlling an operation timing of the data driver 140 and a gate timing control signal GDC for controlling an operation timing of the scan driver 150, based on the driving signal.

The data driver 140 may sample and latch the data signal DATA supplied from the timing controller 130 in response to the data timing control signal DDC supplied from the timing controller 130, and may convert the latched data signal into a gamma reference voltage and output the gamma reference voltage. The data driver 140 may output the converted data signal DATA through data lines DL1 to DLn. The data driver 140 may be embodied in the form of an integrated circuit (IC).

The scan driver 150 may output the scan signal in response to the gate timing control signal GDC supplied from the timing controller 130. The scan driver 150 may output the scan signal through gate lines GL1 to GLm. The scan driver 150 may be embodied in the form of an integrated circuit (IC) or may be embodied in the display panel 110 in a gate-in-panel (GIP) type.

The power supply 160 may output a high potential voltage and a low potential voltage for driving the display panel 110. The power supply 160 may supply the high potential voltage to the display panel 110 through a first power line EVDD and supply the low potential voltage to the display panel 110 through a second power line EVSS.

In the electroluminescence display device according to one example embodiment of the present disclosure, an aging signal for an aging process may be applied to the display panel 110. The aging signal may be supplied to a second electrode (e.g., a cathode) of the light emitting element through the second power line EVSS during aging of the display panel 110. The aging signal may be an inverse current signal input between the first electrode (e.g., the anode) and the second electrode (e.g., the cathode) of the light emitting element. Particles, that is, shorted portions between the first electrode and the second electrode may be spaced apart from each other by an exothermic reaction of heat generated when an inverse current is applied, whereby the shorted state may be removed. As a result, the dark spot caused by the short may be normalized. For example, during normal driving of the electroluminescence display device, the power supply 160 may output a high potential voltage and input the high potential voltage through the first power line EVDD, and may output a low potential voltage and input the low potential voltage through the second power line EVSS.

On the other hand, during aging of the electroluminescence display device, the power supply 160 may generate and output an aging signal which is a high potential voltage driven by a pulse, may input the aging signal to the second electrode (e.g., the cathode) of the light emitting element through the second power line EVSS, and may input no signal or a ground voltage GND to the first power line EVDD without outputting the high potential voltage. Alternatively, the aging signal may be an external signal input regardless of the power supply 160, and an aging signal input from the outside may be input to the second electrode (e.g., the cathode) of the light emitting element through the second power line EVSS.

Figure 2:
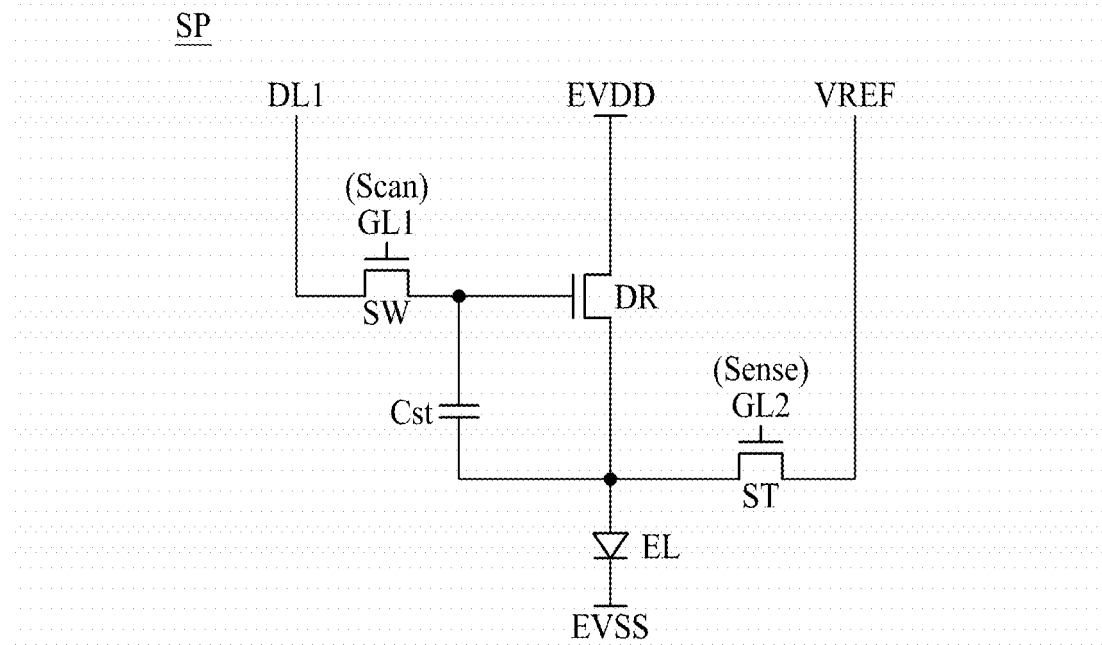
FIG. 2 is a circuit view illustrating a subpixel structure of an electroluminescence display device shown in FIG. 1.

FIG. 2 is a circuit view illustrating a subpixel structure of an example electroluminescence display device shown in FIG. 1.

As illustrated in FIG. 2, one subpixel SP of a unit pixel in an electroluminescence display device according to one example embodiment of the present disclosure may include a switching thin film transistor SW, a driving thin film transistor DR, a sensing thin film transistor ST, a capacitor Cst, and a light emitting element EL.

The switching thin film transistor SW may perform a switching operation such that a data signal supplied through a first data line DL1 in response to a scan signal supplied through a first gate line GL1 is stored in the capacitor Cst as a data voltage. For example, a first electrode of the switching thin film transistor SW may be connected to the first data line DL1, and a second electrode thereof may be connected to a gate electrode of the driving thin film transistor DR.

The driving thin film transistor DR may operate to allow a driving current to flow between the first power line EVDD (e.g., a high potential voltage) and the second power line EVSS (e.g., a low potential voltage) in accordance with the data voltage stored in the capacitor Cst. For example, a first electrode of the driving thin film transistor DR may be connected to the first power line EVDD, and a second electrode thereof may be connected to an anode electrode (or a first electrode) of the light emitting element EL.

The capacitor Cst may be formed between a gate and a source of the driving thin film transistor DR to charge the data voltage transmitted through the switching thin film transistor SW, and the driving thin film transistor DR may be driven in accordance with the voltage charged in the capacitor Cst.

The light emitting element EL may operate to emit light in accordance with the driving current formed by the driving thin film transistor DR. For example, the anode electrode of the light emitting element EL may be connected to the second electrode of the driving thin film transistor DR, and the cathode electrode thereof may be connected to the second power line EVSS. For example, the light emitting element EL may be an organic light emitting diode (OLED).

The sensing thin film transistor ST may be connected to a node (hereinafter, referred to as the sensing node) between the second electrode of the driving thin film transistor DR and the anode electrode of the light emitting element EL. The sensing thin film transistor ST may operate to supply an initialization voltage (or a sensing voltage) transferred through a reference line VREF to the sensing node of the driving thin film transistor DR, or to sense a voltage or current at the sensing node of the driving transistor DR or a voltage or current of the reference line VREF.

The operation timing of the sensing thin film transistor ST may be similar to, identical to, or different from the switching thin film transistor SW, depending on a compensation algorithm (or configuration of a compensation circuit). For example, a gate electrode of the switching thin film transistor SW may be connected to the first gate line GL1, and a gate electrode of the sensing thin film transistor ST may be connected to the second gate line GL2. In this case, a scan signal Scan may be transferred to the first gate line GL1, and a sensing signal Sense may be transferred to the second gate line GL2. For another example, the first gate line GL1 connected to the gate electrode of the switching thin film transistor SW and the second gate line GL2 connected to the gate electrode of the sensing thin film transistor ST may be connected to each other to be commonly shared.

In the example of FIG. 2, a subpixel of a 3T1C structure (three transistors and one capacitor) that includes a switching thin film transistor SW, a driving thin film transistor DR, a capacitor Cst, a light emitting element EL, and a sensing thin film transistor ST has been described as an example, but each subpixel may be configured in any of various other structures, such as 3T2C, 4T2C, 5T1C, 6T2C, 7T1C and 7T2C, depending on the configuration of the compensation circuit.

Meanwhile, the power supply 160 may generate and supply a high potential voltage and a low potential voltage for driving each of the subpixels SP. The high potential voltage generated by the power supply 160 may be input to the anode electrode of the light emitting element EL through the first power line EVDD via the driving thin film transistor DR, and the low potential voltage generated by the power supply 160 may be input to the cathode electrode of the light emitting element EL through the second power line EVSS.

In the subpixel SP of the electroluminescence display device according to an example embodiment of the present disclosure, the light emitting element EL may be formed by sequentially depositing an anode layer (or a first electrode layer), a light emitting layer (or an organic material layer), and a cathode layer (or a second electrode layer) on a substrate. In this case, a short may occur due to particles generated between the anode layer and the cathode layer in the process of depositing an organic material, whereby a dark spot defect or a bright spot defect may occur in the subpixel. Therefore, an aging process for normalizing the dark spot by removing the short caused by the particles may be performed for the electroluminescence display device after the display panel is fabricated but before the display panel is modularized.

Figure 3:
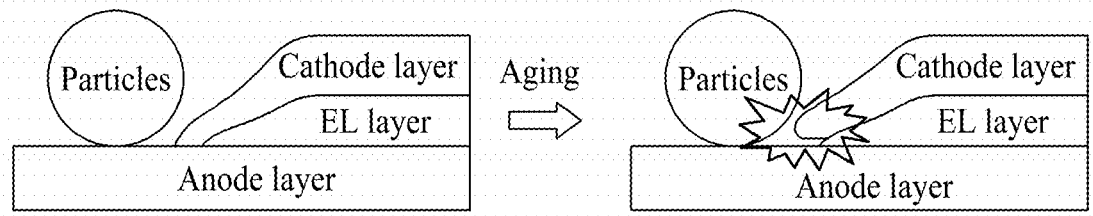
FIG. 3 is a view illustrating the principle of an aging process of an electroluminescence display device according to an example embodiment of the present disclosure.

FIG. 3 is a view illustrating the principle of an aging process of an electroluminescence display device according to an example embodiment of the present disclosure.

As illustrated in FIG. 3, in the electroluminescence display device according to an example embodiment of the present disclosure, an anode layer (e.g., a first electrode), an organic light emitting layer, and a cathode layer (e.g., a second electrode) may sequentially be deposited on a substrate to form a pixel or a subpixel (or a light emitting element). However, a short may occur between the anode and the cathode due to particles. When the anode and the cathode are shorted, a dark spot may occur in the corresponding pixel.

To avoid occurrence of the dark spot, an aging process for applying an aging signal between the anode and the cathode may be performed after elements of the display panel are formed on the substrate. The aging signal may be an inverse current signal input between the anode and the cathode. When an inverse current is applied, particles, that is, shorted portions between the anode and the cathode may become spaced apart from each other by heat of an exothermic reaction to remove the short state, whereby the dark spot caused by the short may be normalized. For example, when the electroluminescence display device is normally driven, the power supply 160 may output a high potential voltage and input the high potential voltage through the first power line EVDD, and may output a low potential voltage and input the low potential voltage through the second power line EVSS. On the other hand, during aging of the electroluminescence display device, the power supply 160 may generate and output an aging signal which may be a high potential voltage driven by a pulse, may input the aging signal to the second electrode (e.g., the cathode) of the light emitting element through the second power line EVSS, and may input no signal or a ground voltage GND to the first power line EVDD without outputting the high potential voltage. Alternatively, the aging signal may be an external signal input regardless of the power supply 160, and an aging signal input from the outside may be input to the second electrode (e.g., the cathode) of the light emitting element through the second power line EVSS.

In order that the short state between the anode and the cathode is removed by the aging process, a maximum allowable current value of the inverse current based on the aging signal may need to be sufficiently increased. However, since the aging signal input through the second power line EVSS during aging of the electroluminescence display device may cause an exothermic reaction in the anode and the cathode and then may be output to the first power line EVDD through the driving thin film transistor DR, the maximum allowable current value of the inverse current based on the aging signal may be limited to an allowable current value of the driving thin film transistor DR.

The electroluminescence display device according to an example embodiment of the present disclosure proposes a pixel structure capable of maximizing or increasing a maximum allowable current value based on an aging signal by adding an auxiliary wiring for allowing an aging signal for an aging process to bypass a driving thin film transistor.

Figure 4:
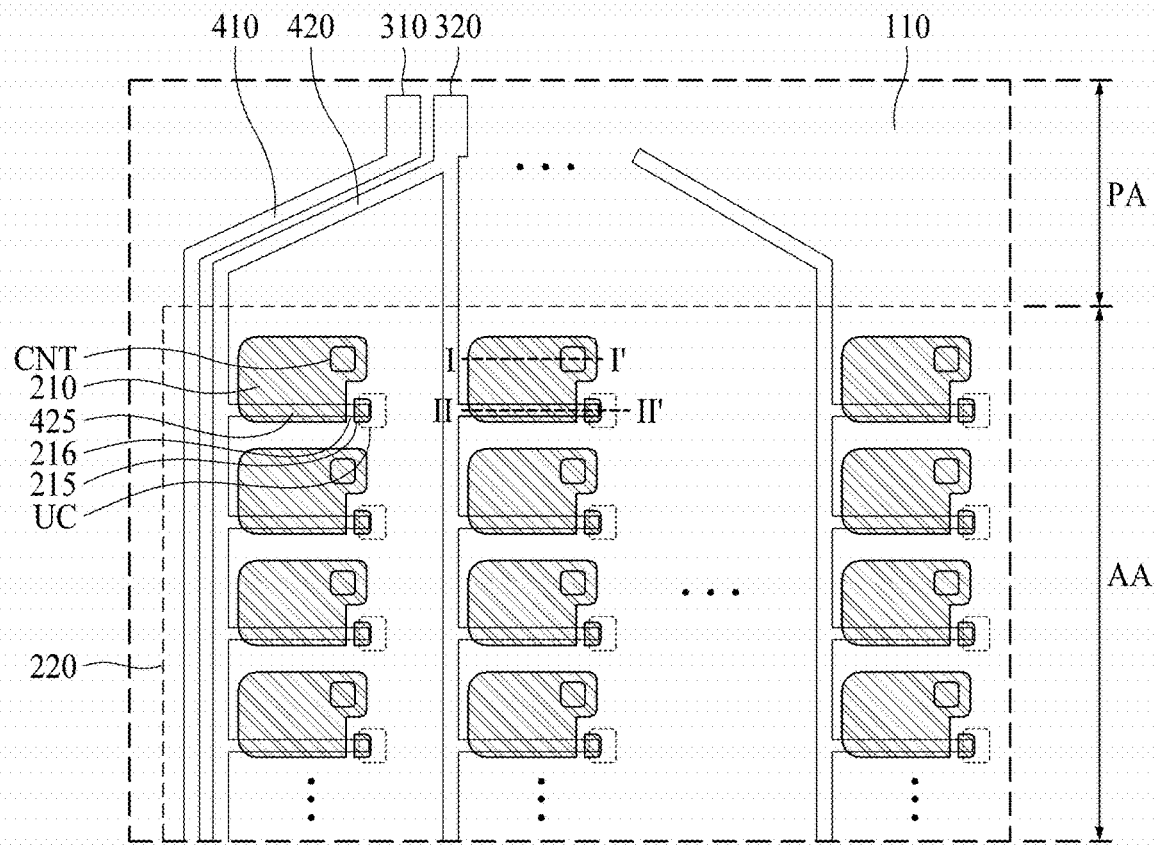
FIG. 4 is a schematic plane view illustrating an electroluminescence display device according to an example embodiment of the present disclosure.
Figure 5:
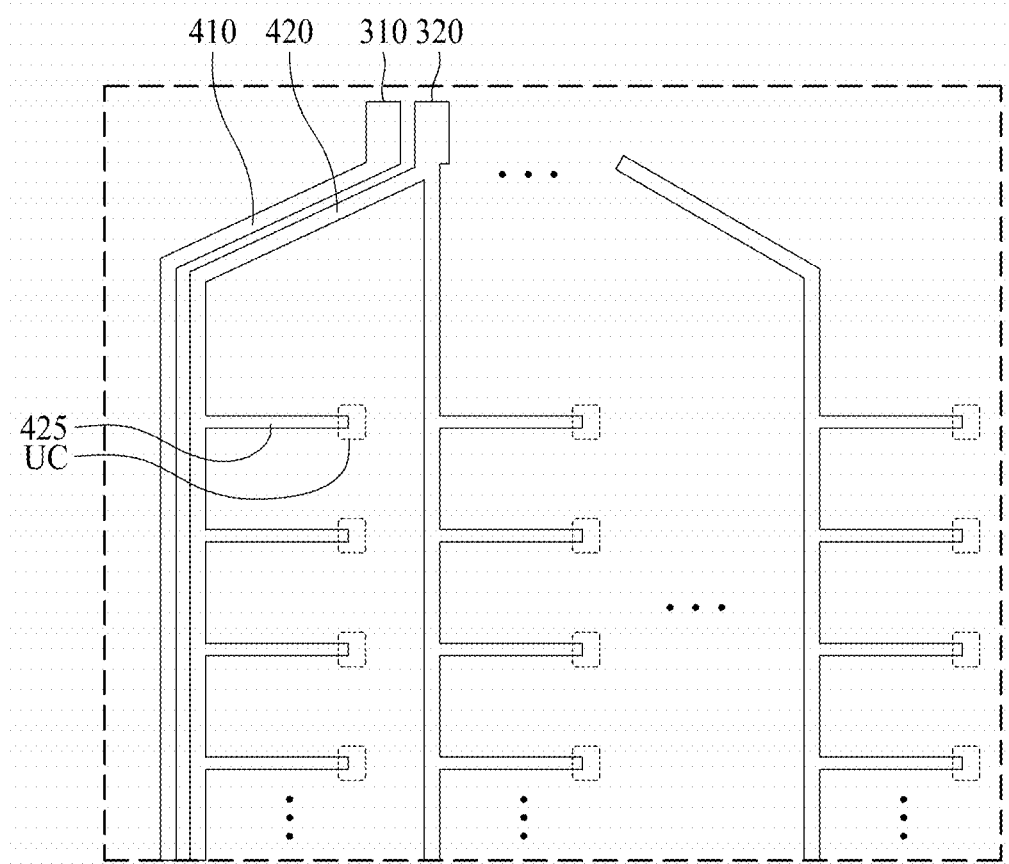
FIGS. 5 to 7 are plane views illustrating a partial single layered structure of FIG. 4.
Figure 6:
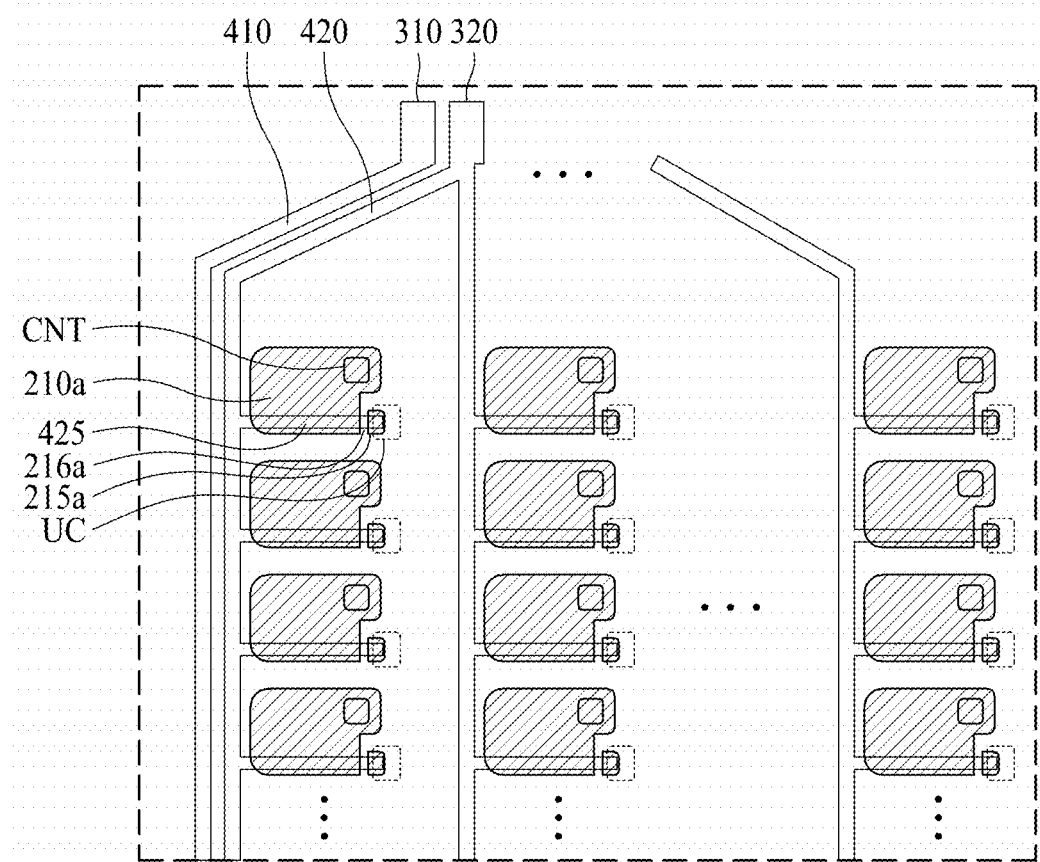
Figure 7:
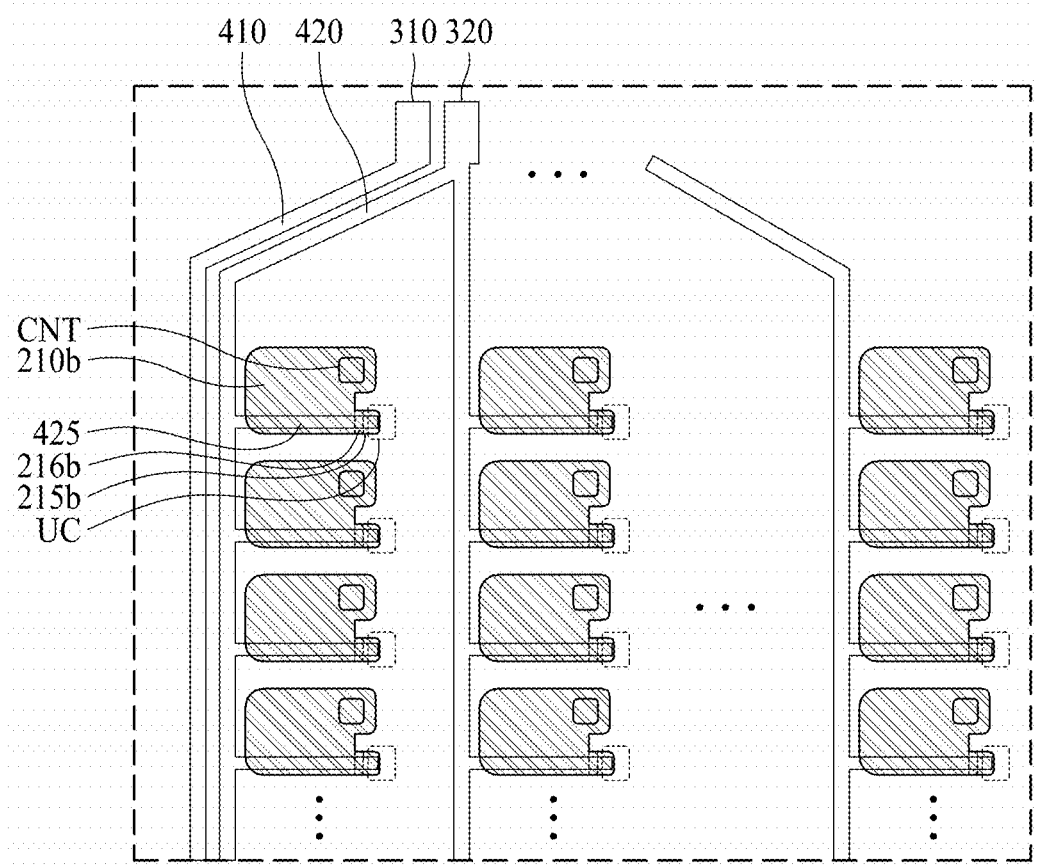
Figure 8:
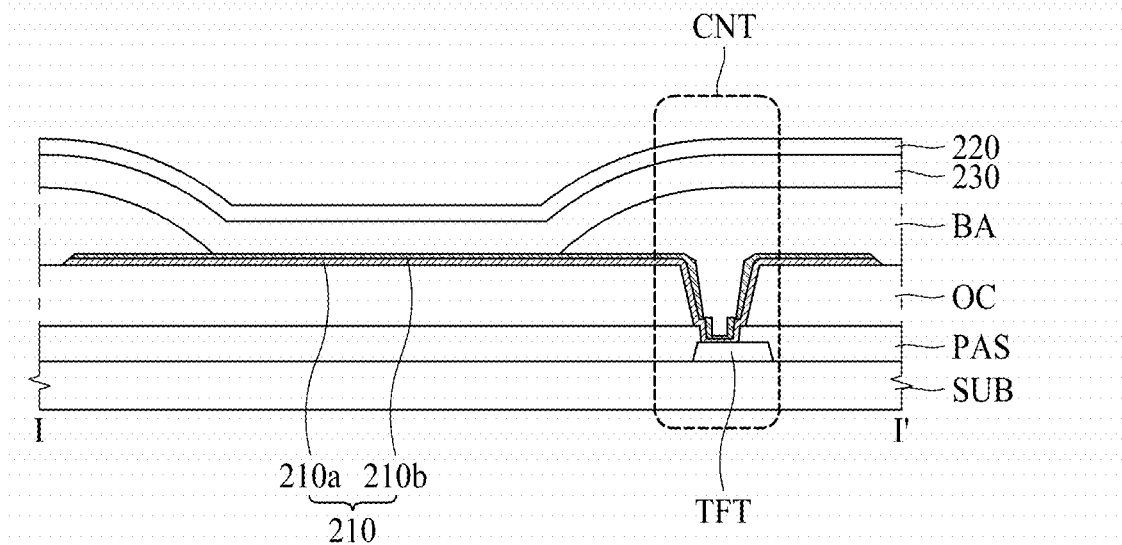
FIG. 8 is a cross-sectional view taken along line I-I' in FIG. 4.
Figure 9:
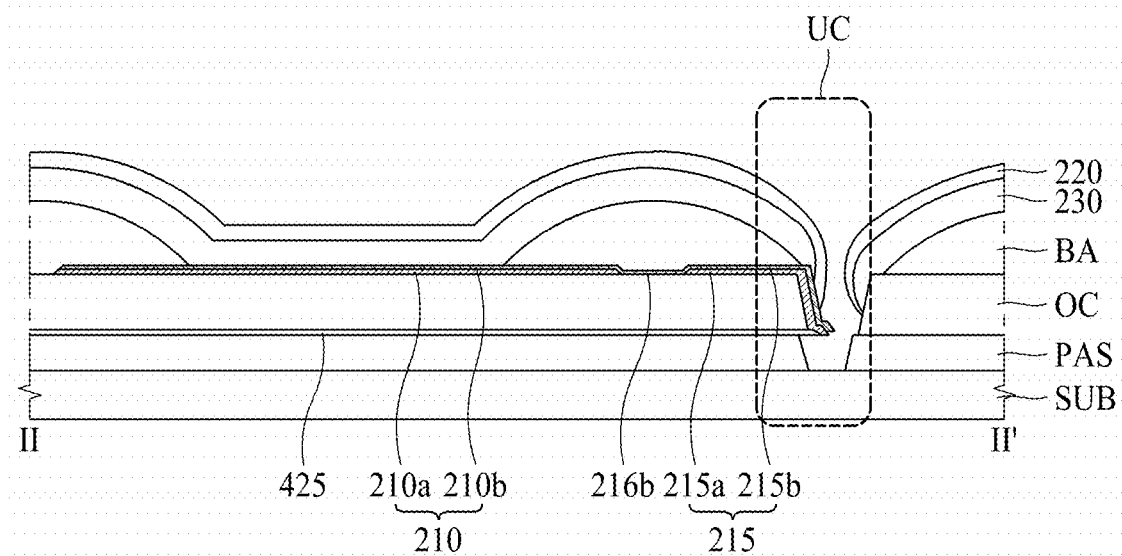
FIG. 9 is a cross-sectional view taken along line II-II' in FIG. 4.
Figure 10:
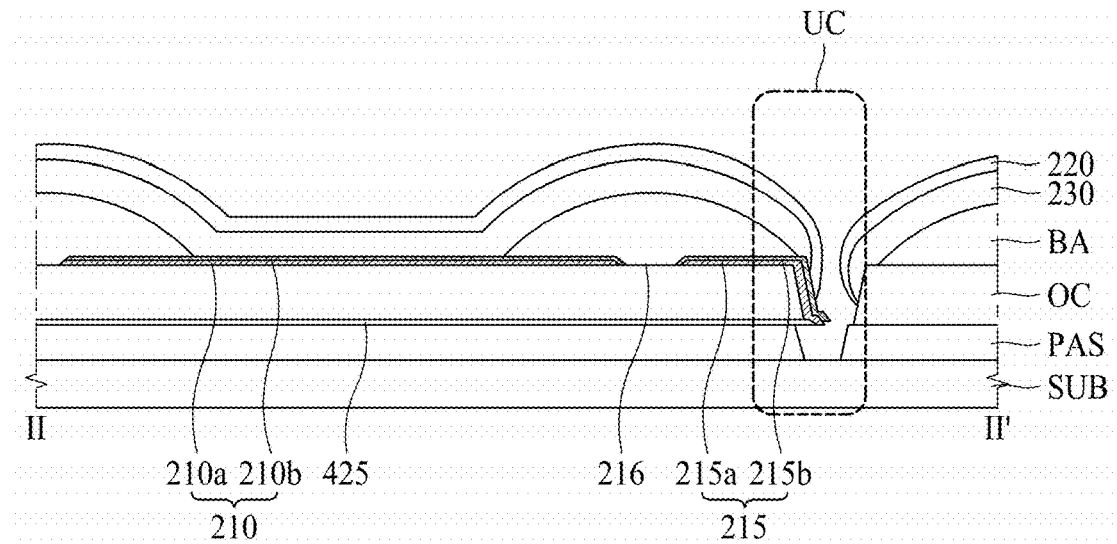
FIG. 10 is a cross-sectional view taken along line II-II' in FIG. 4 after an aging process according to an example embodiment of the present disclosure.

FIG. 4 is a schematic plane view illustrating an electroluminescence display device according to an example embodiment of the present disclosure. FIGS. 5 to 7 are plane views illustrating a partial single layered structure of FIG. 4. FIG. 8 is a cross-sectional view taken along line I-I' in FIG. 4. FIG. 9 is a cross-sectional view taken along line II-II' in FIG. 4. FIG. 10 is a cross-sectional view taken along line II-II' in FIG. 4 after an aging process according to an example embodiment of the present disclosure.

As illustrated in FIGS. 4 to 10 in conjunction with FIG. 1, an electroluminescence display device 100 according to an example embodiment of the present disclosure may include a display panel 110 for displaying an image in response to a data signal DATA and a scan signal, which are respectively supplied from the data driver 140 and the scan driver 150 (shown in FIG. 1), and a power source supplied from the power supply 160. The display panel 110 may include a display area AA in which a plurality of subpixels SP defined by intersection between the plurality of data lines DL1 to DLn and the plurality of gate lines GL1 to GLn (shown in FIG. 1) are formed to display an image, and a pad area PA formed on one side of the display area AA.

As shown in FIG. 4, the plurality of subpixels SP may be disposed in the display area AA. Each subpixel SP may include a pixel area having a light emitting portion and a non-light emitting portion near the light emitting portion. The light emitting portion and the non-light emitting portion may be defined by a bank BA having an opening. The light emitting portion may be positioned corresponding to the opening of the bank BA, and the non-light emitting portion may be positioned to correspond to the bank BA. Each subpixel SP may include a first electrode 210 (e.g., an anode), an auxiliary electrode 215 (e.g., an auxiliary anode), a light emitting layer (not shown), and a second electrode 220 (e.g., a cathode).

The first electrode 210 may be disposed on the light emitting portion of the pixel area of each subpixel SP, and the auxiliary electrode 215 may be disposed on the non-light emitting portion of the pixel area and spaced apart from the first electrode 210. A spacer 216 may be disposed between the first electrode 210 and the auxiliary electrode 215. The light emitting layer may be disposed on the first electrode 210. For example, the first electrode 210 and the auxiliary electrode 215 may be disposed on the same plane, and may be made of the same material. The first electrode 210 and the auxiliary electrode 215 may electrically be connected to each other before an aging process in a manufacturing process of the display panel 110, and may be spaced apart from each other after the aging process and then electrically separated from each other.

The second electrode 220 may be disposed on the pixel area of each subpixel SP and may be connected to the light emitting layer. The second electrode 220 may be formed over an entire surface of the display area AA of the display panel 110.

As shown in FIG. 4, a plurality of power pads 310 and 320 may be disposed in the pad area PA on one side of the display area AA. Each of the power pads 310 and 320 may electrically be connected to the power supply 160 disposed outside the display panel 110 to receive various power voltages for driving the display panel 110.

The first power pad 310 (or a first common power pad) may be a low potential voltage pad for supplying the low potential voltage output from the power supply 160 to the display panel 110. During the aging process, the first power pad 310 may be a high potential voltage pad for supplying an inverse current between the first electrode 210 (or the anode) of the light emitting element and the second electrode 220 (or the cathode). Therefore, when the aging process is performed, the first power pad 310 may be a first aging signal pad for supplying a first aging signal, which is a high potential voltage, to the display panel 110.

For example, the first power pad 310 may electrically be connected to the first wiring line 410 (or a first aging line) during the aging process of an example electroluminescence display device, and may apply the first aging signal, which is the high potential voltage output from the power supply 160, to the second electrode 220 (or the cathode) of the light emitting element through the first wiring line 410. Alternatively, the first power pad 310 may electrically be connected to the first wiring line 410 (or second power line EVSS) during normal driving of the electroluminescence display device, and may apply the low potential voltage output from the power supply 160 to the second electrode 220 (or the cathode) of the light emitting element through the first wiring line 410.

The second power pad 320 (or a second common power pad) may be an auxiliary voltage pad for supplying the auxiliary power voltage output from the power supply 160 to the display panel 110. For example, the auxiliary voltage may be a ground voltage or a low potential voltage. Alternatively, the second power pad 320 may be a signal for applying an inverse current between the first electrode 210 (or the anode) of the light emitting element and the second electrode 220 (or the cathode) during the aging process. Therefore, the second power pad 320 may be a second aging signal pad for supplying a second aging signal, which may be a low potential voltage and have a constant potential difference with the first aging signal, to the display panel 110.

For example, the second power pad 320 may be electrically connected to a second wiring line 420 (or an auxiliary power line). In addition, the second wiring line 420 may be electrically connected to an auxiliary power electrode 425 disposed to at least partially overlap the first electrode 210 (or the anode) and the auxiliary electrode 215 (or the auxiliary anode) of the light emitting element with at least one insulating film interposed therebetween. For example, as shown in FIGS. 9 and 10, the auxiliary power electrode 425 may be disposed below the first electrode 210 and the auxiliary electrode 215 with at least one insulating film (e.g., overcoat layer OC) interposed therebetween, and may be electrically connected with the auxiliary electrode 215 and the second electrode 220 at an end of the auxiliary power electrode 425 through an undercut structure UC. According to an example embodiment of the present disclosure, as shown in FIG. 9, the first electrode 210 and the auxiliary electrode 215 may be electrically connected to each other before the aging process in the manufacturing process of the display panel 110. Also, as shown in FIG. 10, the first electrode 210 and the auxiliary electrode 215 may be spaced apart from each other after the aging process in the manufacturing process of the display panel 110 and then be electrically separated from each other.

In the electroluminescence display device according to an example embodiment of the present disclosure, the first electrode 210 and the auxiliary electrode 215 may be electrically connected with each other before the aging process. As illustrated in FIG. 9, before the aging process, the auxiliary electrode 215 may be electrically connected with the first electrode 210. At this time, the end of the auxiliary power electrode 425 may be electrically connected with the auxiliary electrode 215 and the second electrode 220 through the undercut structure UC.

During the aging process of the electroluminescence display device, the second aging signal, which may be the low potential voltage output from the power supply 160, may be applied to the auxiliary power electrode 425 through the second wiring line 420.

In accordance with the aging process, the first aging signal, which may be the high potential voltage, may be applied from the first power pad 310 to the second electrode 220 through the first wiring line 410. The second aging signal, which may be the low potential voltage, may be applied from the second power pad 320 to the auxiliary power electrode 425 through the second wiring line 420. As shown in FIGS. 4 and 9, the auxiliary power electrode 425 may be connected with the auxiliary electrode 215, and the auxiliary electrode 215 may be connected with the first electrode 210 and the second electrode 220. Therefore, the first electrode 210, the auxiliary electrode 215, the second electrode 220, and the auxiliary power electrode 425 may be electrically connected with one another. Accordingly, an inverse current due to a potential difference between the first aging signal and the second aging signal may generate heat between the first electrode 210 and the second electrode 220, and may be output externally through the second wiring line 420 after passing through the first electrode 210, the auxiliary electrode 215, and the auxiliary power electrode 425. Therefore, the aging process may be performed without affecting the driving thin film transistor DR connected with the light emitting element EL.

In the electroluminescence display device according to an example embodiment of the present disclosure, as shown in FIG. 4, after the aging process, the first electrode 210 and the auxiliary electrode 215 may be spaced apart from each other with the spacer 216 interposed therebetween. During the normal driving of the electroluminescence display device, the second power pad 320 may be electrically connected with the second wiring line 420 and the auxiliary power electrode 425. In addition, the auxiliary power voltage may be applied to the auxiliary power electrode 425 electrically connected with the second electrode 220 through the second wiring line 420 so that electrical resistance of the second electrode 220 of the light emitting element may be lowered. At this time, the end of the auxiliary power electrode 425 may be connected with the auxiliary electrode 215 through an undercut structure UC. However, through the aging process, electrical connection between the auxiliary electrode 215 and the first electrode 210 may be disconnected. Therefore, the electrical connection between the auxiliary power electrode 425 and the first electrode 210 may be disconnected, and the electrical connection between the auxiliary power electrode 425 and the second electrode 220 may be maintained. The auxiliary power electrode 425 may be electrically connected with the second electrode 220 through the auxiliary electrode 215 electrically disconnected from the first electrode 210. In addition, the electrical resistance of the second electrode 220 may be reduced by the auxiliary power electrode 425 electrically connected with the second electrode 220. Therefore, the auxiliary power electrode 425 may serve as an auxiliary cathode electrode capable of reducing the electrical resistance of the second electrode 220. At this time, the second power pad 320 electrically connected with the auxiliary power electrode 425 may be electrically floating.

The electroluminescence display device according to an example embodiment of the present disclosure will be described in more detail with reference to FIGS. 5 through 10 in conjunction with FIG. 4.

As shown in FIG. 5, a plurality of power pads 310 and 320 may be disposed on a substrate, and a first wiring line 410 and a second wiring line 420, which are respectively connected to the plurality of power pads 310 and 320, may be formed on the substrate.

The plurality of power pads 310 and 320 may be connected with a flexible film, such as a Chip On Film (COF), and may receive various power voltages output from the power supply 160 through the flexible film. The first power pad 310 (or the first common power pad) of the plurality of power pads 310 and 320 may supply the low potential voltage output from the power supply 160 to the display panel 110, or may supply a first aging signal, which may be the high potential voltage, to the display panel 110 as a signal for applying an inverse current between the first electrode 210 (or the anode) and the second electrode 220 (or the cathode) of the light emitting element during the aging process.

The second power pad 320 (or the second common power pad) may supply the auxiliary power voltage output from the power supply 160 to the display panel 110, or supply a second aging signal, which may be the low potential voltage and have a constant potential difference with the first aging signal, to the display panel 110 as a signal for applying an inverse current between the first electrode 210 (or the anode) and the second electrode 220 (or the cathode) of the light emitting element during the aging process.

The first wiring line 410 may be electrically connected with the first power pad 310, and may be connected to the second electrode 220 (or the cathode) of the light emitting element to apply the low potential voltage supplied through the first power pad 310 to the second electrode 220. Also, during the aging process, the first wiring line 410 may apply the first aging signal supplied through the first power pad 310 to the second electrode 220.

The second wiring line 420 may be electrically connected with the second power pad 320. The second wiring line 420 may be electrically connected with the auxiliary power electrode 425. As shown in FIGS. 9 and 10, the auxiliary power electrode 425 may be disposed to at least partially overlap the first electrode 210 (or the anode) and the auxiliary electrode 215 (or the auxiliary anode) of the light emitting element with at least one insulating film (e.g., overcoat layer OC) interposed therebetween. The second wiring line 420 and the auxiliary power electrode 425 may be connected to the auxiliary electrode 215 to apply the auxiliary power voltage supplied through the second power pad 320 to the auxiliary electrode 215. During the aging process, the second wiring line 420 may apply the second aging signal supplied through the second power pad 320 to the auxiliary electrode 215.

As shown in FIG. 8, at least one thin film transistor TFT may be disposed below the plurality of power pads 310 and 320 and the first and second wiring lines 410 and 420, and a passivation layer PAS covering the thin film transistor TFT may be formed below the power pads 310 and 320 and the first and second wiring lines 410 and 420.

At least one thin film transistor TFT may be disposed below the elements shown in FIG. 5, and the passivation layer PAS covering the thin film transistor TFT may be formed below the elements shown in FIG. 5. An overcoat layer OC may be disposed on the elements shown in FIG. 5. The overcoat layer OC may be a planarization layer that mitigates a step difference generated by a lower structure. An undercut structure UC may be formed in the passivation layer PAS and the overcoat layer OC so that an end of the auxiliary power electrode 425 may be exposed.

The first electrode 210 (or the anode), the second electrode 220 (or the cathode), and a light emitting element having a light emitting layer interposed between the first electrode 210 and the second electrode 220 may be formed on the overcoat layer OC.

As shown in FIG. 6, at least a first metal pattern 210a constituting the first electrode 210 (or the anode) and a first metal layer 215a constituting the auxiliary electrode 215 (or the auxiliary anode) spaced apart from the first electrode 210 may be formed on the overcoat layer OC. The first metal pattern 210a and the first metal layer 215a may be disposed on the same plane, and may be made of the same material. The first metal layer 215a may be formed in an island pattern with a spacer 216a interposed between the first metal pattern 210a and the first metal layer 215a. The auxiliary power electrode 425 may be disposed below the first metal pattern 210a of the first electrode 210 and the first metal layer 215a of the auxiliary electrode 215 with the overcoat layer OC interposed therebetween, and an end of the auxiliary power electrode 425 may be electrically connected with the first metal layer 215a of the auxiliary electrode 215 through an undercut structure UC of the passivation layer PAS and the overcoat layer OC.

As shown in FIG. 7, another metal layer may be formed on the first metal pattern 210a of the first electrode 210 and the first metal layer 215a of the auxiliary electrode 215 to integrally cover the first metal pattern 210a and the first metal layer 215a, respectively. This additional metal layer may include a second metal pattern 210b corresponding to the first metal pattern 210a, a second metal layer 215b corresponding to the first metal layer 215a, and a high resistance metal layer 216b corresponding to the spacer 216a between the first metal pattern 210a and the first metal layer 215a. In the electroluminescence display device according to an example embodiment of the present disclosure, the first electrode 210 and the auxiliary electrode 215 may be electrically connected with each other by the high resistance metal layer 216b before the aging process.

After the first electrode 210 and the auxiliary electrode 215 are formed, a bank BA defining a light emitting portion and a non-light emitting portion may be formed. Then, a light emitting layer 230 may be formed on the first electrode 210, and the second electrode 220 may be formed on the light emitting layer 230.

FIGS. 8 and 9 illustrate cross-sectional views before an aging process for the electroluminescence display device according to an example embodiment of the present disclosure, and FIG. 10 illustrates a cross-sectional view after the aging process.

As shown in FIG. 8, the thin film transistor TFT may be formed on the substrate SUB, and the passivation layer PAS may be formed on the thin film transistor TFT. The overcoat layer OC may be formed on the passivation layer PAS, and the first electrode 210 may be formed on the overcoat layer OC. In addition, a bank BA defining a light emitting portion and a non-light emitting portion may be formed on the first electrode 210, and a light emitting layer 230 may be formed on the first electrode 210 exposed through an opening of the bank BA and the bank BA. The second electrode 220 may be formed on the light emitting layer 230 formed on the first electrode 210 and the bank BA. The first electrode 210 may be electrically connected with the thin film transistor TFT through a contact hole CNT formed in the passivation layer PAS and the overcoat layer OC. The first electrode 210 may include a first metal pattern 210a at a lower portion and a second metal pattern 210b at an upper portion.

As shown in FIG. 9, the passivation layer PAS may be formed on the substrate SUB, and the auxiliary power electrode 425 may be formed on the passivation layer PAS. The overcoat layer OC may be formed on the auxiliary power electrode 425, and the first electrode 210 and the auxiliary electrode 215 may be formed on the overcoat layer OC. In addition, the bank BA defining a light emitting portion and a non-light emitting portion may be formed on the first electrode 210 and the auxiliary electrode 215. The light emitting layer 230 may be formed on the first electrode 210 exposed through the opening of the bank BA and the bank BA. The second electrode 220 may be formed on the light emitting layer 230 disposed on the first electrode 210 and the bank BA. The first electrode 210 may include a first metal pattern 210a at a lower portion and a second metal pattern 210b at an upper portion. The first electrode 210 may be positioned in the light emitting portion corresponding to an opening of the bank BA. The auxiliary electrode 215 may include a first metal layer 215a at a lower portion and a second metal layer 215b at an upper portion. The auxiliary electrode 215 may be positioned in the non-light emitting portion corresponding to the bank BA. The second metal pattern 210b of the first electrode 210 and the second metal layer 215b of the auxiliary electrode 215 may be electrically connected to each other by the high resistance metal layer 216b.

In addition, an undercut structure UC may be formed at an end of the auxiliary power electrode 425 in the passivation layer PAS and the overcoat layer OC. For example, the undercut structure UC may be formed such that the end of the auxiliary power electrode 425 serves as or has a shape of an eave. The protective layer PAS and the overcoat layer OC facing the eave structure by the end of the auxiliary power electrode 425 may have a stepped structure. The undercut structure UC may be formed in such a manner that the passivation layer PAS is inwardly recessed from the end of the auxiliary power electrode 425 to expose an underneath portion of the end of the auxiliary power electrode 425. In addition, the undercut structure UC may be formed in such a manner that the overcoat layer OC is inwardly recessed to expose an upper portion of the end of the auxiliary power electrode 425. The auxiliary electrode 215 formed on the overcoat layer OC may be electrically connected with the end of the auxiliary power electrode 425 through the undercut structure. In addition, the second electrode 220 may be electrically connected with the auxiliary power electrode 425 via the auxiliary electrode 215 in the undercut structure UC of the passivation layer PAS and the overcoat layer OC.

In the electroluminescence display device according to an example embodiment of the present disclosure, as shown in FIG. 9, before the aging process, the first electrode 210 and the auxiliary electrode 215 may be electrically connected to each other by the high resistance metal layer 216b. In this structure, during the aging process of the electroluminescence display device, the first aging signal, which may be the high potential voltage, may be applied to the second electrode 220 through the first wiring line 410 connected to the first power pad 310. Also, the second aging signal, which may be the low potential voltage, may be applied to the auxiliary power electrode 425 through the second wiring line 420 connected to the second power pad 320. Then, as the first electrode 210, the auxiliary electrode 215, the second electrode 220, and the auxiliary power electrode 425 may be electrically connected with one another. An inverse current based on a potential difference between the first aging signal and the second aging signal may generate heat between the first electrode 210 and the second electrode 220. In addition, since the heat generated between the first electrode 210 and the second electrode 220 may be emitted externally through the second wiring line 420 after passing through the first electrode 210, the auxiliary electrode 215, and the auxiliary power electrode 425, the aging process may be performed without affecting the thin film transistor TFT.

In the electroluminescence display device according to an example embodiment of the present disclosure, as shown in FIG. 10, after the aging process, the high resistance metal layer 216b between the first electrode 210 and the auxiliary electrode 215 may be disconnected or removed, and the spacer 216 may be disposed therebetween. For example, the aging process may primarily remove a short area, which is caused by particles, between the first electrode 210 and the second electrode 220, and may secondarily remove the high resistance metal layer 216b between the first electrode 210 and the auxiliary electrode 215. For example, in the primary aging process, a first aging signal having a first potential difference may be applied to solve the short state between the first electrode 210 and the second electrode 220. In the secondary aging process, a second aging signal having a second potential difference greater than the first potential difference may be applied to remove the high resistance metal layer 216b between the first electrode 210 and the auxiliary electrode 215. Alternatively, the aging signal applied during the aging process may be set such that the potential difference is gradually increased, whereby the short removal between the first electrode 210 and the second electrode 220 and the removal of the high resistance metal layer 216b may sequentially be performed.

In the electroluminescence display device according to an example embodiment of the present disclosure, as shown in FIG. 10, after the aging process, the first electrode 210 and the auxiliary electrode 215 may be spaced apart from each other with the spacer 216 interposed therebetween. In this structure, the second power pad 320 may be electrically connected with the second wiring line 420 and the auxiliary power electrode 425, and an auxiliary power voltage may be applied to the auxiliary power electrode 425 electrically connected with the second electrode 220 through the second wiring line 420 so as to lower electrical resistance of the second electrode 220 of the light emitting element. As the electrical connection between the first electrode 210 and the auxiliary electrode 215 is disconnected through the aging process, the electrical connection between the auxiliary power electrode 425 and the first electrode 210 may be disconnected. Therefore, only the electrical connection between the auxiliary power electrode 425 and the second electrode 220 may be maintained. As the auxiliary power electrode 425 is electrically connected with the second electrode 220, the auxiliary power electrode 425 may serve as an auxiliary cathode electrode capable of reducing the electrical resistance of the second electrode 220. At this time, the second power pad 320 electrically connected with the auxiliary power electrode 425 may be electrically floating.

FIGS. 11 to 15 are circuit diagrams illustrating an aging process according to an example embodiment of the present disclosure.

The aging process in the electroluminescence display device according to an example embodiment of the present disclosure will be described in more detail with reference to FIGS. 11 to 15.

Figure 11:
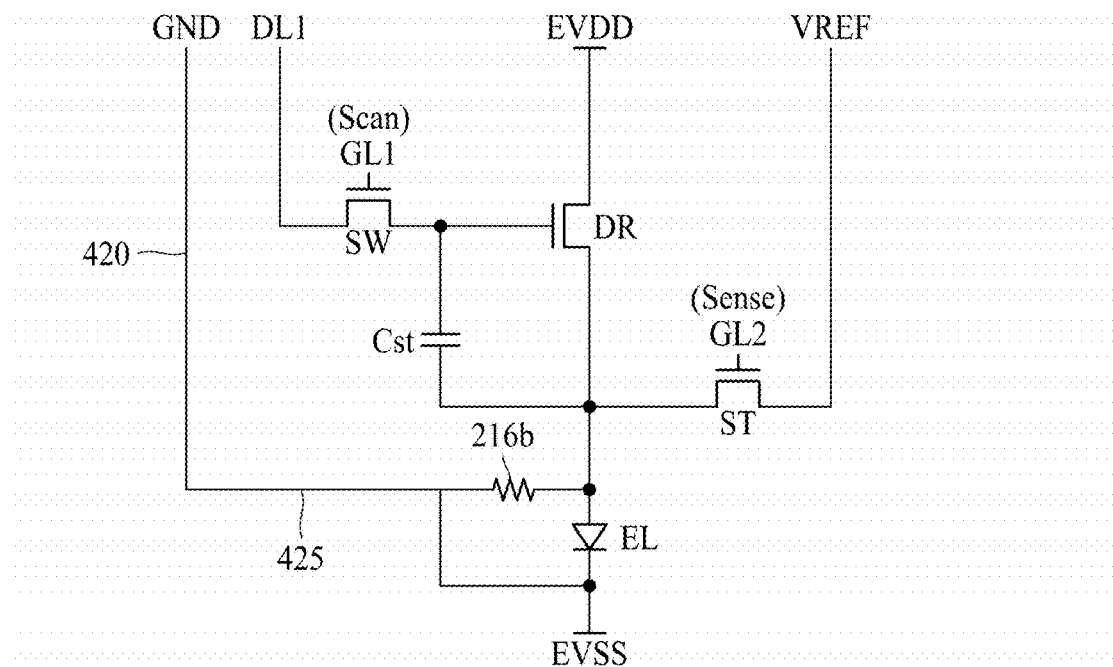
FIGS. 11 to 15 are circuit views illustrating an aging process according to an example embodiment of the present disclosure.

As shown in FIG. 11, the auxiliary power electrode 425 may be connected to the anode (or the first electrode) and the cathode (or the second electrode) of the light emitting element EL in parallel, and may be connected to a ground GND through the second wiring line 420. A resistance based on the high resistance metal layer 216b may be disposed between the anode (or the first electrode) of the light emitting element EL and the auxiliary power electrode 425.

Figure 12:
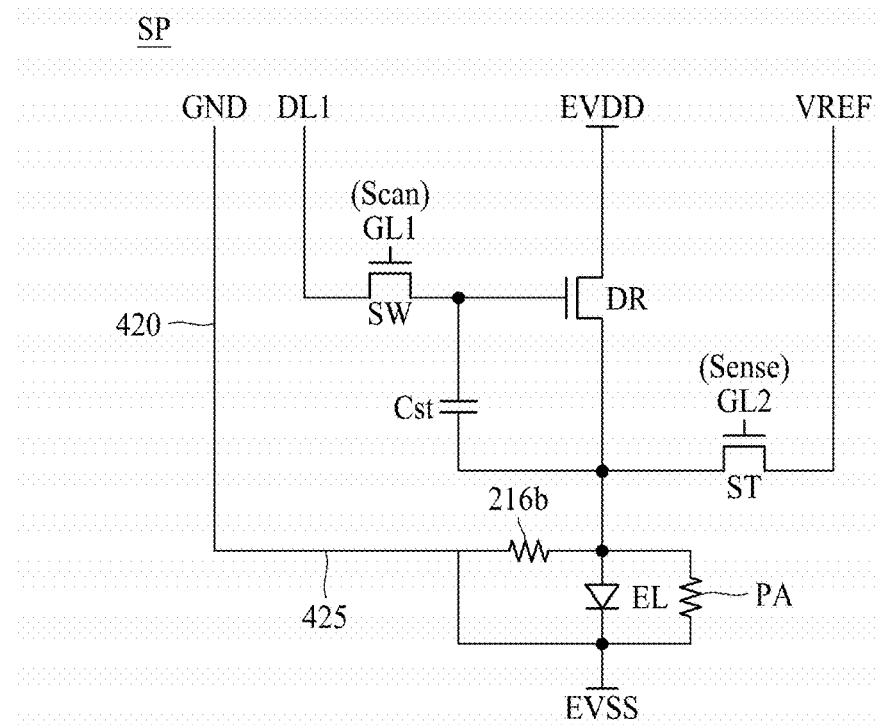

As shown in FIG. 12, when particles PA are placed between the anode (or the first electrode) and the cathode (or the second electrode) of the light emitting element EL, a short may occur between the anode (or the first electrode) and the cathode (or the second electrode) of the light emitting element EL.

Figure 13:
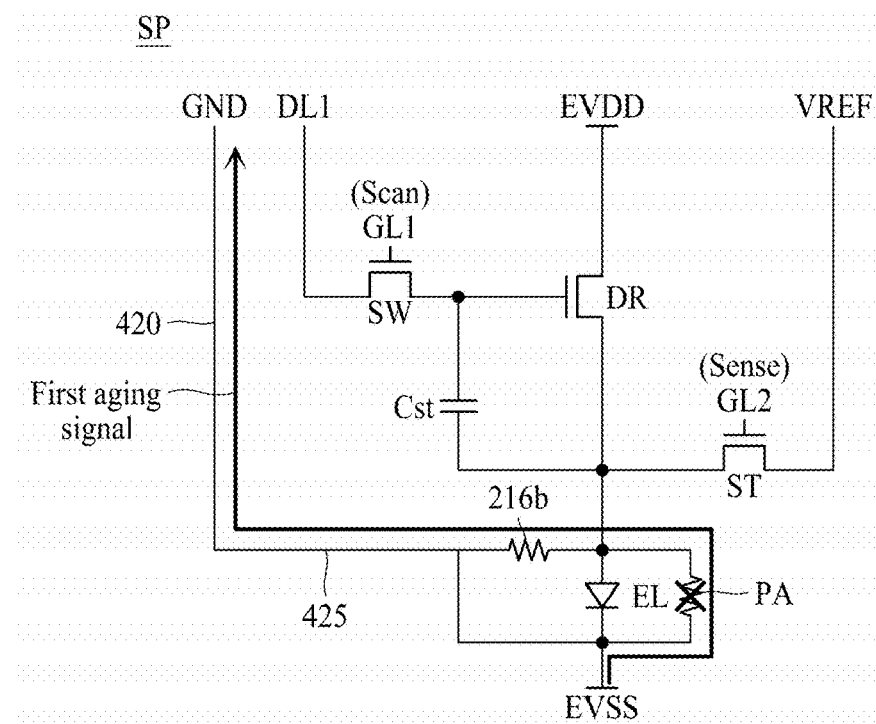

As shown in FIG. 13, in the primary aging process, the first aging signal, which may be the high potential voltage different from the low potential voltage during the normal driving, may be applied to the cathode (or the second electrode) of the light emitting element EL via the second power line EVSS. The second aging signal, which may be the low potential voltage having a predetermined potential difference with the first aging signal, may be applied to the ground GND. The first aging signal, which may be an inverse current signal, may generate heat between the cathode and the anode and may emit the heat to the ground GND through the auxiliary power electrode 425 and the second wiring line 420. Then, the short caused by the particles PA may be removed by the heat generated between the cathode and the anode, whereby the light emitting element EL may be normalized. At this time, since the first aging signal may be applied to the ground GND without flowing toward the first power line EVDD, the aging process may be performed without affecting the driving thin film transistor DR. Therefore, the first aging signal may maximize a maximum allowable current value without being limited to the allowable current value of the driving thin film transistor DR, whereby the effect of the aging process may be improved.

Figure 14:
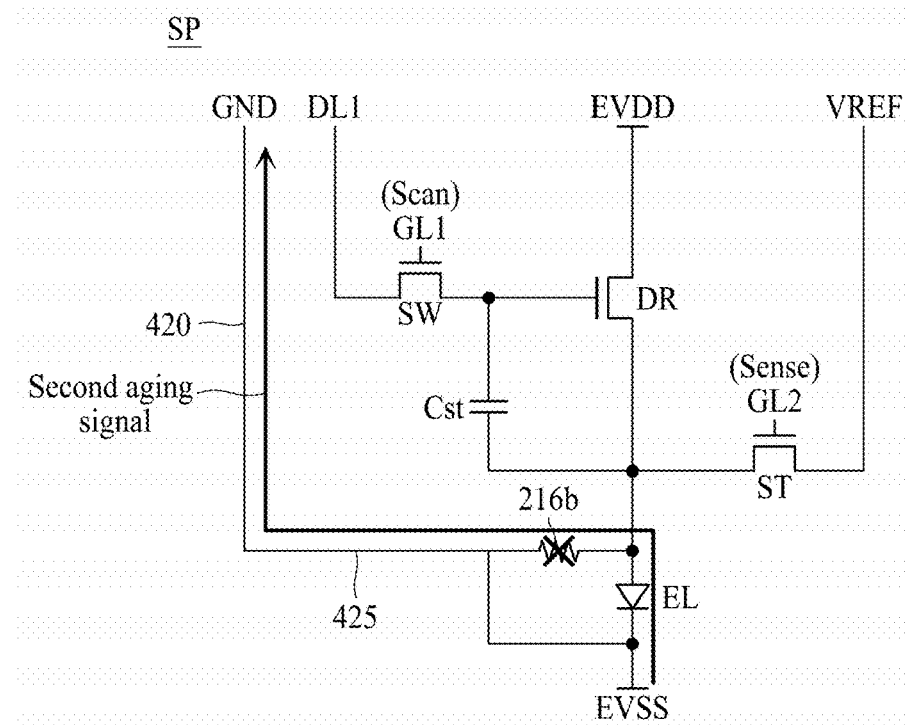

As shown in FIG. 14, in the secondary aging process, the second aging signal having a potential difference greater than that of the first aging signal may be applied. The second aging signal may generate heat in the high resistance metal layer 216b between the anode (or the first electrode) of the light emitting element EL and the auxiliary power electrode 425, and may remove the high resistance metal layer 216b by the generated heat. Alternatively, the aging signal applied during the primary and secondary aging processes may be set such that the potential difference is gradually increased, whereby the short removal between the first electrode 210 and the second electrode 220 and the removal of the high resistance metal layer 216b may sequentially be performed. In addition, in the case of a light emitting element in which a short between the anode and the cathode due to the particles PA is not generated during the aging process, only a secondary aging process for removing the high resistance metal layer 216b may be performed.

Figure 15:
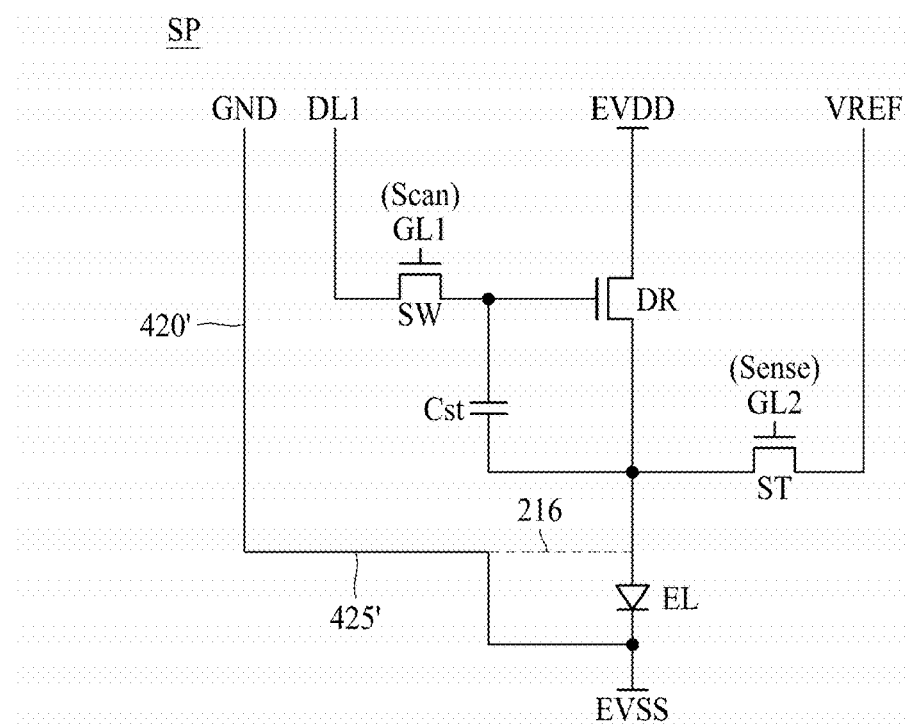

As shown in FIG. 15, after the aging process, the high resistance metal layer 216b between the anode (or the first electrode) of the light emitting element EL and the auxiliary power electrode 425 may be removed, whereby the spacer 216 may be positioned between the anode (or the first electrode) and the auxiliary power electrode 425. The second wiring line 420 and the auxiliary power electrode 425 may be electrically connected to the cathode, but not the anode, of the light emitting element EL, whereby auxiliary cathode electrodes 425' and 420' may be formed.

Figure 16:
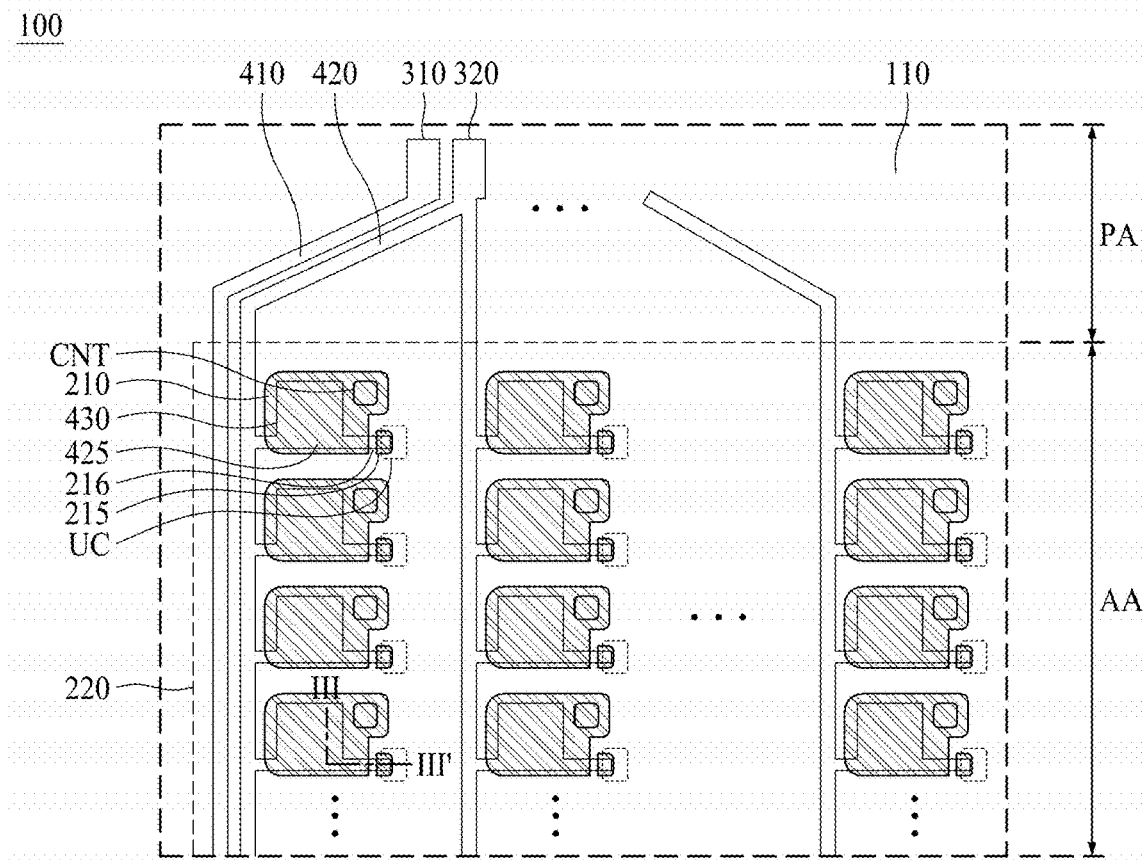
FIG. 16 is a schematic plane view illustrating an electroluminescence display device according to an example embodiment of the present disclosure.
Figure 17:
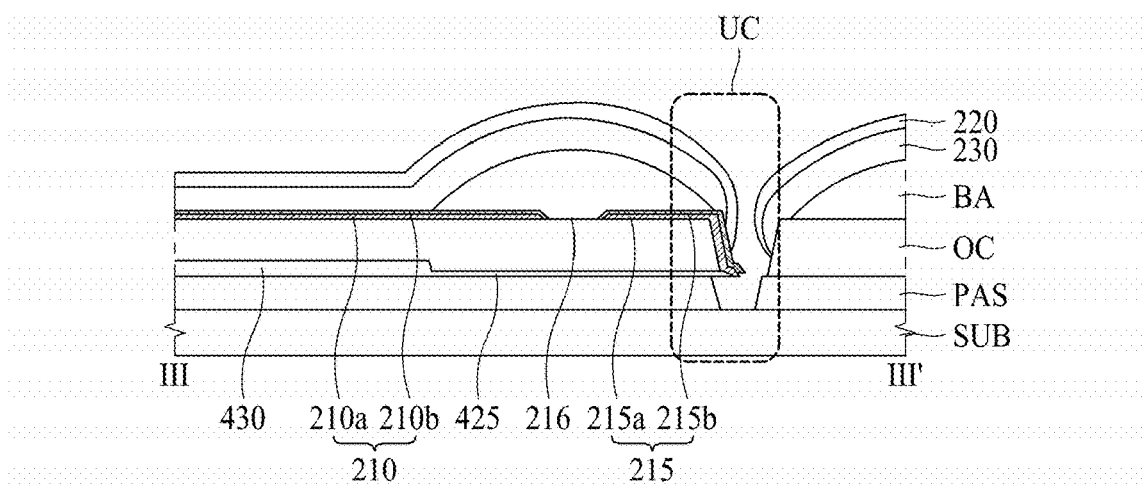
FIG. 17 is a cross-sectional view taken along line III-III' in FIG. 16.

FIG. 16 is a schematic plane view illustrating an electroluminescence display device according to an example embodiment of the present disclosure. FIG. 17 is a cross-sectional view taken along line III-III' in FIG. 16. A structure of the example electroluminescence display device in FIG. 16 is modified from the example electroluminescence display device shown in FIG. 4 such that the reflective metal pattern 430 is added to the auxiliary power electrode 425. Therefore, in the following description, only the elements modified from the example electroluminescence display device of FIG. 4 will be described, and the description of the other elements will be omitted.

As shown in FIGS. 16 and 17, the auxiliary power electrode 425 of the electroluminescence display device 100 according to an example embodiment of the present disclosure may include a reflective metal pattern 430 disposed below the first electrode 210 and overlapped with the light emitting portion of the pixel area.

As shown in FIG. 17, the reflective metal pattern 430 may be disposed to overlap the first electrode 210 below the first electrode 210 where the light emitting portion corresponding to the opening of the bank BA is positioned. If the bank BA is formed of a transparent material, the reflective metal pattern 430 may serve to prevent light refracted through the bank BA from being directed to the thin film transistor TFT disposed below the overcoat layer OC and the passivation layer PAS.

Figure 18:
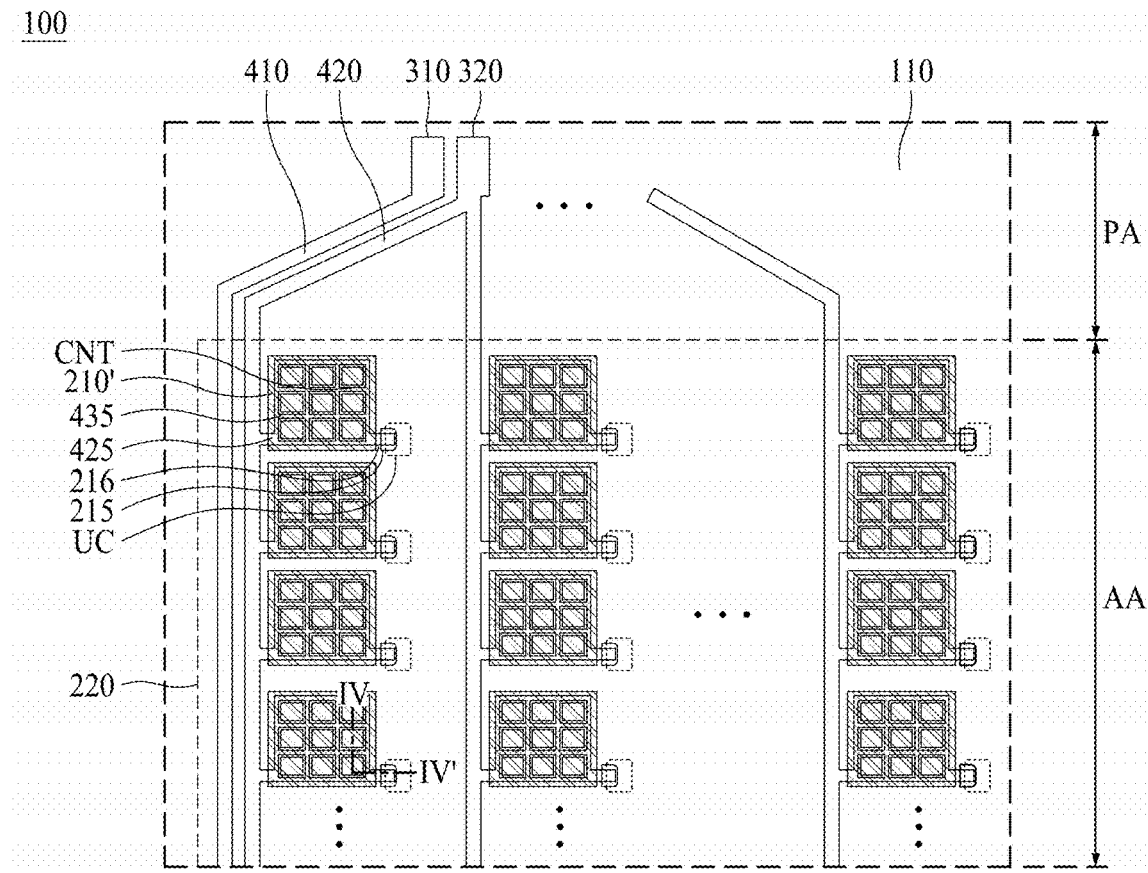
FIG. 18 is a schematic plane view illustrating an electroluminescence display device according to an example embodiment of the present disclosure.
Figure 19:
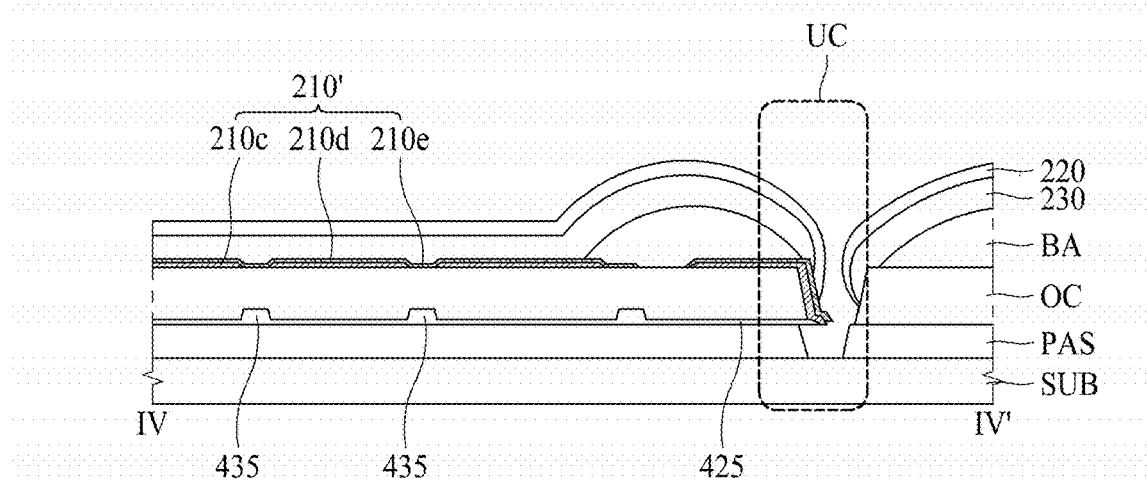
FIG. 19 is a cross-sectional view taken along line IV-IV' in FIG. 18.

FIG. 18 is a schematic plane view illustrating an electroluminescence display device according to an example embodiment of the present disclosure. FIG. 19 is a cross-sectional view taken along line IV-IV' in FIG. 18. A structure of the example electroluminescence display device in FIG. 18 is modified from the example electroluminescence display device shown in FIG. 4 such that the first electrode 210 is modified to a first electrode 210' of a grid shape and a grid reflective metal pattern 435 is added to the auxiliary power electrode 425. Therefore, in the following description, only the elements modified from the example electroluminescence display device of FIG. 4 will be described, and the description of the other elements will be omitted.

As shown in FIGS. 18 and 19, the first electrode 210' of the electroluminescence display device 100 according to an example embodiment of the present disclosure may include a plurality of first metal patterns 210c and a second metal pattern 210d covering the plurality of first metal patterns 210c, and may include a grid pattern 210e comprised of a second metal pattern 210d directly contacting the overcoat layer OC between the plurality of first metal patterns 210c. The first electrode 210' may be formed such that the plurality of first metal patterns 210c are spaced apart from each other and are electrically connected to each other by the second metal pattern 210d. When a short occurs between the anode and the cathode due to particles placed on a specific position of the plurality of first metal patterns 210c, only the second metal pattern or patterns 210d around the shorted first metal pattern or patterns 210c may locally be removed by the aging process. Then, the first electrode 210' does not become a dark spot in its entirety. Instead, only a specific portion of the first electrode 210', that is, a specific first metal pattern 210c in which particles are placed, and a portion where the second metal pattern 210d around such specific first metal pattern 210c is positioned may become dark spots, and the other areas of the first electrode 210' may normally emit light.

As shown in FIG. 19, the grid reflective metal pattern 435 may be disposed below the first electrode 210 where the light emitting portion corresponding to the opening of the bank BA is positioned. The grid reflective metal pattern 435 may be formed in a grid structure in which it does not overlap with the plurality of first metal patterns 210c of the first electrode 210' and but overlaps with the grid pattern 210e. The grid reflective metal pattern 435 may serve to prevent the light passing through the grid pattern 210e of the first electrode 210' from being directed to the thin film transistor TFT disposed below the overcoat layer OC and the passivation layer PAS.

In the example electroluminescence display device 100 shown in FIGS. 18 and 19, as a grid pattern 210e having a trench structure is formed on the first electrode 210', when particles are placed on a specific pattern of the plurality of first metal patterns 210c, the grid pattern 210e around the corresponding pattern may easily be removed during the aging process, whereby the effect of the aging process may be improved.

The electroluminescence display device according to various embodiments of the present disclosure may be described as follows.

An electroluminescence display device according to an embodiment of the present disclosure may comprise a substrate including a pixel area having a light emitting portion and a non-light emitting portion adjacent to the light emitting portion; a first electrode in the light emitting portion of the pixel area; an auxiliary electrode in the non-light emitting portion of the pixel area and spaced apart from the first electrode; a light emitting layer on the first electrode; a second electrode on the light emitting layer in the pixel area and connected to the light emitting layer; and an auxiliary power electrode below the first electrode and electrically connected with the auxiliary electrode.

In the electroluminescence display device according to an embodiment of the present disclosure, the first electrode may include at least one first metal pattern and a second metal pattern covering the at least one first metal pattern.

In the electroluminescence display device according to an embodiment of the present disclosure, the auxiliary electrode may include a first metal layer spaced apart from the at least one first metal pattern of the first electrode and second metal layer covering the first metal layer.

In the electroluminescence display device according to an embodiment of the present disclosure, the first metal layer may include a same material as the at least one first metal pattern, and the second metal layer may include a same material as the second metal pattern.

In the electroluminescence display device according to an embodiment of the present disclosure, the auxiliary power electrode may include a reflective metal pattern overlapping with the light emitting portion of the pixel area in a plan view.

In the electroluminescence display device according to an embodiment of the present disclosure, the first electrode may include a plurality of first metal patterns and a second metal pattern covering the plurality of first metal patterns, and the auxiliary power electrode may include a grid reflective metal pattern that overlaps with the light emitting portion of the pixel area and does not overlap with the plurality of first metal patterns in a plan view.

In the electroluminescence display device according to an embodiment of the present disclosure, the second electrode may be electrically connected with the auxiliary power electrode via the auxiliary electrode.

In the electroluminescence display device according to an embodiment of the present disclosure, the first electrode is spaced apart and electrically disconnected from the auxiliary electrode.

The electroluminescence display device according to an embodiment of the present disclosure may further comprise a passivation layer on the substrate and below the auxiliary power electrode, the passivation layer having an opening, wherein an end of the auxiliary power electrode may be connected with the auxiliary electrode over the opening in the passivation layer.

In the electroluminescence display device according to an embodiment of the present disclosure, the end of the auxiliary power electrode may have an eave structure over the opening in the passivation layer.

The electroluminescence display device according to an embodiment of the present disclosure may further comprise an overcoat layer on the auxiliary power electrode and below the auxiliary electrode, wherein the overcoat layer may have an opening at least partially aligned with the opening in the passivation layer, and wherein the second electrode may be connected with the auxiliary electrode in the opening of the overcoat layer.

An electroluminescence display device according to an embodiment of the present disclosure may comprise a substrate having a display area and a pad area; a light emitting element in the display area and having a first electrode, a second electrode, and a light emitting layer interposed between the first electrode and the second electrode; an auxiliary electrode in the display area and spaced apart from the first electrode; and a power pad in the pad area and including a first common power pad electrically connected with the second electrode and a second common power pad electrically connected with the auxiliary electrode.

In the electroluminescence display device according to an embodiment of the present disclosure, the first common power pad may be configured to provide an input power to the second electrode through a first wiring line.

In the electroluminescence display device according to an embodiment of the present disclosure, the second common power pad may be electrically connected with the second electrode and the auxiliary electrode through a second wiring line, and may be configured to be electrically floating.

The electroluminescence display device according to an embodiment of the present disclosure may further comprise an auxiliary power electrode below the first electrode and electrically connecting the second wiring line with the auxiliary electrode.

The electroluminescence display device according to an embodiment of the present disclosure may further comprise a passivation layer on the substrate and an auxiliary power electrode on the passivation layer and below the auxiliary electrode, the auxiliary power electrode being electrically connected with the second common power pad, wherein the auxiliary power electrode may be connected with the auxiliary electrode.

In the electroluminescence display device according to an embodiment of the present disclosure, the passivation layer may have an opening, and the auxiliary power electrode may have an end portion connected with the auxiliary electrode and having an eave structure over the opening in the passivation layer.

The electroluminescence display device according to an embodiment of the present disclosure may further comprise an overcoat layer on the auxiliary power electrode and below the auxiliary electrode, wherein the overcoat layer and the passivation layer each may have an opening, the opening of the overcoat layer being at least partially aligned with the opening in the passivation layer, and wherein the second electrode may be connected with the auxiliary electrode in the opening of the overcoat layer.

In the electroluminescence display device according to an embodiment of the present disclosure, the second electrode may be electrically connected with the auxiliary electrode.

In the electroluminescence display device according to an embodiment of the present disclosure, the first electrode may be spaced apart and electrically disconnected from the auxiliary electrode, and the first electrode and the auxiliary electrode may be on a same underlying layer and include a same material.

According to the present disclosure, the following advantageous effects may be obtained.

The electroluminescence display device according to example embodiments of the present disclosure may maximize the maximum allowable current value based on the aging signal by adding the auxiliary wiring for allowing the aging signal for the aging process to bypass the driving thin film transistor, thereby improving the effect of the aging process.

In addition, the electroluminescence display device according to example embodiments of the present disclosure may minimize electrical resistance of the cathode by utilizing the auxiliary wiring for the aging process as the auxiliary electrode of the cathode.

It will be apparent to those skilled in the art that various substitutions, modifications, and variations are possible within the scope of the present disclosure without departing from the spirit and scope of the present disclosure. Therefore, it is intended that embodiments of the present disclosure cover the various substitutions, modifications, and variations of the present disclosure, provided they come within the scope of the appended claims and their equivalents.

What is claimed is:

1. The electroluminescence display device, comprising:
    a substrate including a pixel area having a light emitting portion and a non-light emitting portion adjacent to the light emitting portion;
    a first electrode in the light emitting portion of the pixel area;
    an auxiliary electrode in the non-light emitting portion of the pixel area and spaced apart from the first electrode;
    a light emitting layer on the first electrode;
    a second electrode on the light emitting layer in the pixel area and connected to the light emitting layer; and
    an auxiliary power electrode below the first electrode and electrically connected with the auxiliary electrode, the auxiliary power electrode being electrically connected with the second electrode and insulated from the first electrode,
    wherein the auxiliary power electrode and the first electrode overlap, and the auxiliary power electrode electrically connects the auxiliary electrode and an auxiliary power line, and
    wherein the auxiliary power electrode overlaps with an entire width of the first electrode in a plan view.

2. The electroluminescence display device of claim 1, wherein the first electrode includes:
    at least one first metal pattern; and a second metal pattern covering the at least one first metal pattern.

3. The electroluminescence display device of claim 2, wherein the auxiliary electrode includes:
   a first metal layer spaced apart from the at least one first metal pattern of the first electrode; and
   a second metal layer covering the first metal layer.

4. The electroluminescence display device of claim 3, wherein the first metal layer includes a same material as the at least one first metal pattern, and the second metal layer includes a same material as the second metal pattern.

5. The electroluminescence display device of claim 1, wherein the auxiliary power electrode includes a reflective metal pattern overlapping with the light emitting portion of the pixel area in a plan view.

6. The electroluminescence display device of claim 1, wherein the first electrode includes:
   a plurality of first metal patterns; and
   a second metal pattern covering the plurality of first metal patterns, and
   wherein the auxiliary power electrode includes a grid reflective metal pattern that overlaps with the light emitting portion of the pixel area and does not overlap with the plurality of first metal patterns in a plan view.

7. The electroluminescence display device of claim 1, wherein the second electrode is electrically connected with the auxiliary power electrode via the auxiliary electrode.

8. The electroluminescence display device of claim 1, wherein the first electrode is spaced apart and electrically disconnected from the auxiliary electrode.

9. The electroluminescence display device of claim 1, further comprising a passivation layer on the substrate and below the auxiliary power electrode, the passivation layer having an opening,
   wherein an end of the auxiliary power electrode is connected with the auxiliary electrode over the opening in the passivation layer.

10. The electroluminescence display device of claim 9, wherein the end of the auxiliary power electrode has an eave structure over the opening in the passivation layer.

11. The electroluminescence display device of claim 9, further comprising an overcoat layer on the auxiliary power electrode and below the auxiliary electrode,
   wherein the overcoat layer has an opening at least partially aligned with the opening in the passivation layer, and
   wherein the second electrode is connected with the auxiliary electrode in the opening of the overcoat layer.

12. An electroluminescence display device, comprising:
   a substrate having a display area and a pad area;
   a light emitting element in the display area and having a first electrode, a second electrode, and a light emitting layer interposed between the first electrode and the second electrode;
   an auxiliary electrode in the display area and spaced apart from the first electrode;
   an auxiliary power electrode below the first electrode, the auxiliary power electrode being electrically connected with the second electrode and insulated from the first electrode; and
   a power pad in the pad area and including:
      a first common power pad electrically connected with the second electrode; and
      a second common power pad electrically connected with the auxiliary electrode,
   wherein the second common power pad is electrically connected with the second electrode and the auxiliary electrode through a second wiring line, the second common power pad being configured to be electrically floating,
   wherein the auxiliary power electrode electrically connects the second wiring line with the auxiliary electrode, and
   wherein the auxiliary power electrode overlaps with an entire width of the first electrode in a plan view.

13. The electroluminescence display device of claim 12, wherein the first common power pad is configured to provide an input power to the second electrode through a first wiring line.

14. The electroluminescence display device of claim 12, further comprising:
   a passivation layer on the substrate,
   wherein the auxiliary power electrode is on the passivation layer and below the auxiliary electrode, the auxiliary power electrode being electrically connected with the second common power pad, and
   wherein the auxiliary power electrode is connected with the auxiliary electrode.

15. The electroluminescence display device of claim 14, wherein the passivation layer has an opening, and
   wherein the auxiliary power electrode has an end portion connected with the auxiliary electrode and having an eave structure over the opening in the passivation layer.

16. The electroluminescence display device of claim 14, further comprising an overcoat layer on the auxiliary power electrode and below the auxiliary electrode,
   wherein the overcoat layer and the passivation layer each have an opening, the opening of the overcoat layer being at least partially aligned with the opening in the passivation layer, and
   wherein the second electrode is connected with the auxiliary electrode in the opening of the overcoat layer.

17. The electroluminescence display device of claim 12, wherein the second electrode is electrically connected with the auxiliary electrode.

18. The electroluminescence display device of claim 17, wherein the first electrode is spaced apart and electrically disconnected from the auxiliary electrode, and
   wherein the first electrode and the auxiliary electrode are on a same underlying layer and include a same material.

19. The electroluminescence display device of claim 12, further comprising a spacer in a space between the first electrode and the auxiliary electrode, the spacer directly contacting the first electrode and the auxiliary electrode.

20. The electroluminescence display device of claim 1, further comprising a spacer in a space between the first electrode and the auxiliary electrode, the spacer directly contacting the first electrode and the auxiliary electrode.

* * * * *